United States Patent [19]

Kopp

[11] 4,191,897
[45] Mar. 4, 1980

[54] SELF-CLOCKING CIRCUIT
[75] Inventor: Arthur R. Kopp, Lewisberry, Pa.
[73] Assignee: AMP Incorporated, Harrisburg, Pa.
[21] Appl. No.: 898,357
[22] Filed: Apr. 21, 1978
[51] Int. Cl.² .......................................... H03K 5/153
[52] U.S. Cl. ................................. 307/234; 307/232;
    307/246; 307/294; 328/109; 328/111; 329/107;
    340/171 PF
[58] Field of Search ...................... 328/127, 109, 111;
    307/232, 246, 294, 234; 329/107; 340/171 PF

[56] References Cited
U.S. PATENT DOCUMENTS 3,206,684  9/1965  Der et al. ......................... 307/232 X
3,555,512  1/1971  Mustain .......................... 340/171 PF
3,705,417  12/1972  Asmussen ............................. 307/234
3,831,039  8/1974  Henschel ............................. 307/234
3,988,688  10/1976  Wu ...................................... 329/107

Primary Examiner—John S. Heyman
Attorney, Agent, or Firm—Russell J. Egan; Richard O'Planick

[57] ABSTRACT

A circuit is disclosed for separating clock and data pulses contained in a pulse train resulting from reading a two frequency encoded magnetic recording. The subject invention obviates the previous requirements for sample and hold circuits and employs bipolar transistors only in a timing circuit.

8 Claims, 6 Drawing Figures

SELF-CLOCKING CIRCUIT

BACKGROUND OF THE INVENTION

1. The Field of the Invention

The present invention relates to a circuit for separating clock and data pulses contained in a pulse train and more particularly to a circuit which separates clock and data pulses independent of time values or frequency over a design range of about 40 to 1.

2. The Prior Art

The purpose of the present circuit is to provide an economical technique for performing a self-clocking function over a wide frequency range. The subject circuit is intended for use in magnetic recording playback detection, however, the circuit could find application wherever fixed duty cycle pulses are required. Previously it was necessary to provide sample and hold circuits in order to attain a self-clocking function. The subject invention obviates this requirement by employing only bipolar transistors.

The input to the circuit is a train of relatively narrow pulses separated by 2 to 1 time relationships. An object of the circuit is to be independent of the time values or frequency over a design range of about 40 to 1. The circuit distinguishes a 2 to 1 ratio as long as the input frequency does not change rapidly.

The input pulse train is the result of conventional signal processing techniques performed on a real head signal in a magnetic recording application. The information encoding technique may be called F/2F, Aiken, two frequency coherent phase or phase-Manchester recording where the definition of binary 1's and 0's simply differ. A preamble of F rather than 2F frequency is written before any data in order to synchronize the self-clocking circuit.

SUMMARY OF THE INVENTION

The present invention relates to a circuit for separating clock and data pulses independent of time values or frequency and includes a reset-discharge transistor, a main saw tooth capacitor having a constant charging source, a voltage follower-impedance buffer, a charging diode, a discharge capacitor with a constant discharge source, and a current threshold sensing switch.

It is therefore an object of the present invention to produce an improved clock and data pulse separating circuit which will reliably separate the pulses of two frequency encoded magnetic recordings.

It is a further object of the present invention to produce an improved circuit for separating clock and data pulses which circuit can be readily and economically manufactured.

The means for accomplishing the foregoing objects and other advantages of the present invention will become apparent to those skilled in the art from the following detailed description taken with reference to the accompanying drawings.

DETAILED DESCRIPTION OF THE PREFERRED EMBODIMENT

Figure 1:
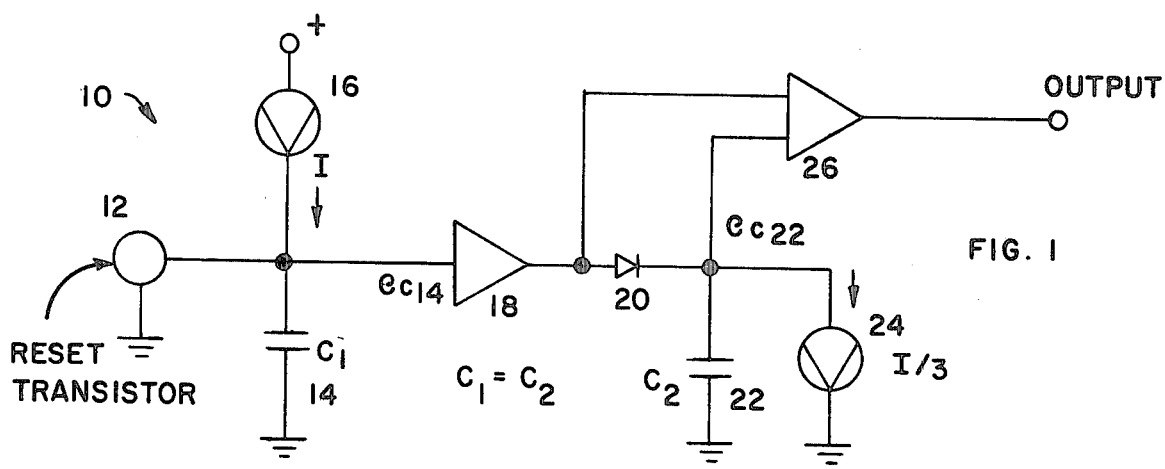
FIG. 1 is a simplified schematic of the subject fixed duty cycle timer circuit.

Turning to FIG. 1, the basic elements of the subject circuit 10 include a reset transistor 12; a main saw tooth capacitor 14, hereinafter referred to as C14; a constant current charging source 16 for delivering a constant current I to C14; a voltage follower impedance buffer 18; a unidirectional charging element 20, shown to be a diode; a discharge capacitor 22, hereinafter referred to as C22; a constant current discharge source 24 for discharging C22 at a constant rate of I/3, and a current threshold switch 26.

C22 follows capacitor C14 in voltage during a portion of the cycle. The current required to charge C22 is sensed and causes the output voltage to change levels during that cycle portion. An input reset pulse from transistor 12 causes capacitor C14 to rapidly discharge. The charging element 20 is shut off removing the charging current to capacitor C22. This causes the output to change voltage level states and causes capacitor C22 to discharge at a rate determined by current discharge source 24. During the first portion of the cycle, capacitor C14 charges at a rate determined by the current from source 16. When capacitor C14 charges to a voltage equal to that remaining on capacitor C22, the charging member 20 conducts and capacitor 22 charges again as previously described. Capacitor C14 continues to charge until reset by the input pulse from the transistor 12.

To mathematically illustrate the operation of the circuit in FIG. 1 in producing a fixed duty cycle, let C14=C22, I represent the constant charging current rate from source 16, I/3 represent the constant discharge current rate from source 24, Ec1 represent the final value of both C22 and C14 voltages, Tf represent the input pulse interval, and t represent the variable time at the beginning portion of the cycle, it follows that:

$$E_{c1} = \frac{IT_f}{C14}; \tag{1}$$

$$e_{C22} = E_{c1} - \frac{It}{3C}; \text{ and} \tag{2}$$

$$e_{C14} = \frac{It}{C} \tag{3}$$

Letting $e_{C14} = e_{C22}$, the point at which the output switches, and combining equations:

$$\frac{It}{C} = \frac{IT_f}{C} - \frac{It}{3C}; \tag{4}$$

(5) $3t = 3T_f - t;$ (6) $4t = 3T_f;$ (7) $t = \frac{3}{4}T_f.$

This equation says that for relative values chosen the output waveform will have a 75% duty cycle for any and all values of Tf. Other current and capacitor ratios could produce other duty cycles if desired. An assumption employed is that $T_f$ does not vary significantly from one cycle to the next.

Figure 2A:
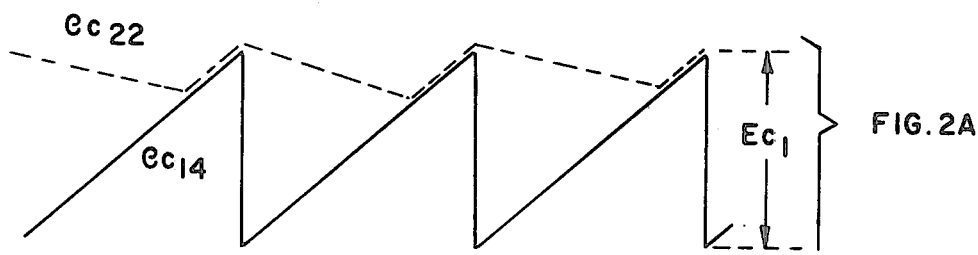
FIG. 2A is a graphical representation of the potential levels across the two capacitors of FIG. 1 during a series of timing cycles.
Figure 2B:
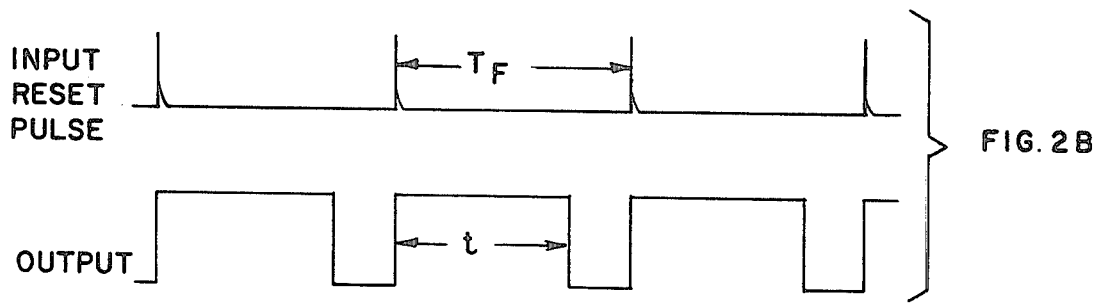
FIG. 2B is a graphical representation of the input-output waves of the subject circuit shown in FIG. 1, presented synchronically with the potential graphs of FIG. 2A.

FIGS. 2A and 2B further illustrate, in a graphical manner, the fixed relationship between the duty cycle and the input interval of the subject circuit as C14 and C22 are subjected to a series of charge-discharge cycles. FIGS. 2A and 2B are synchronically drawn to better illustrate the timing functions of the instant circuit. For a given input pulse interval $T_f$, the duty cycle duration t will be fixed by the value of C14 and C22, and by the constant charging current rate I and the constant discharge current rate (I/3 as assumed above). More specifically, it is the comparative relationship between the values of C14 and C22, and the rate at which C14 is recharged and C22 discharged that determines the duration of the duty cycle.

Figure 3:
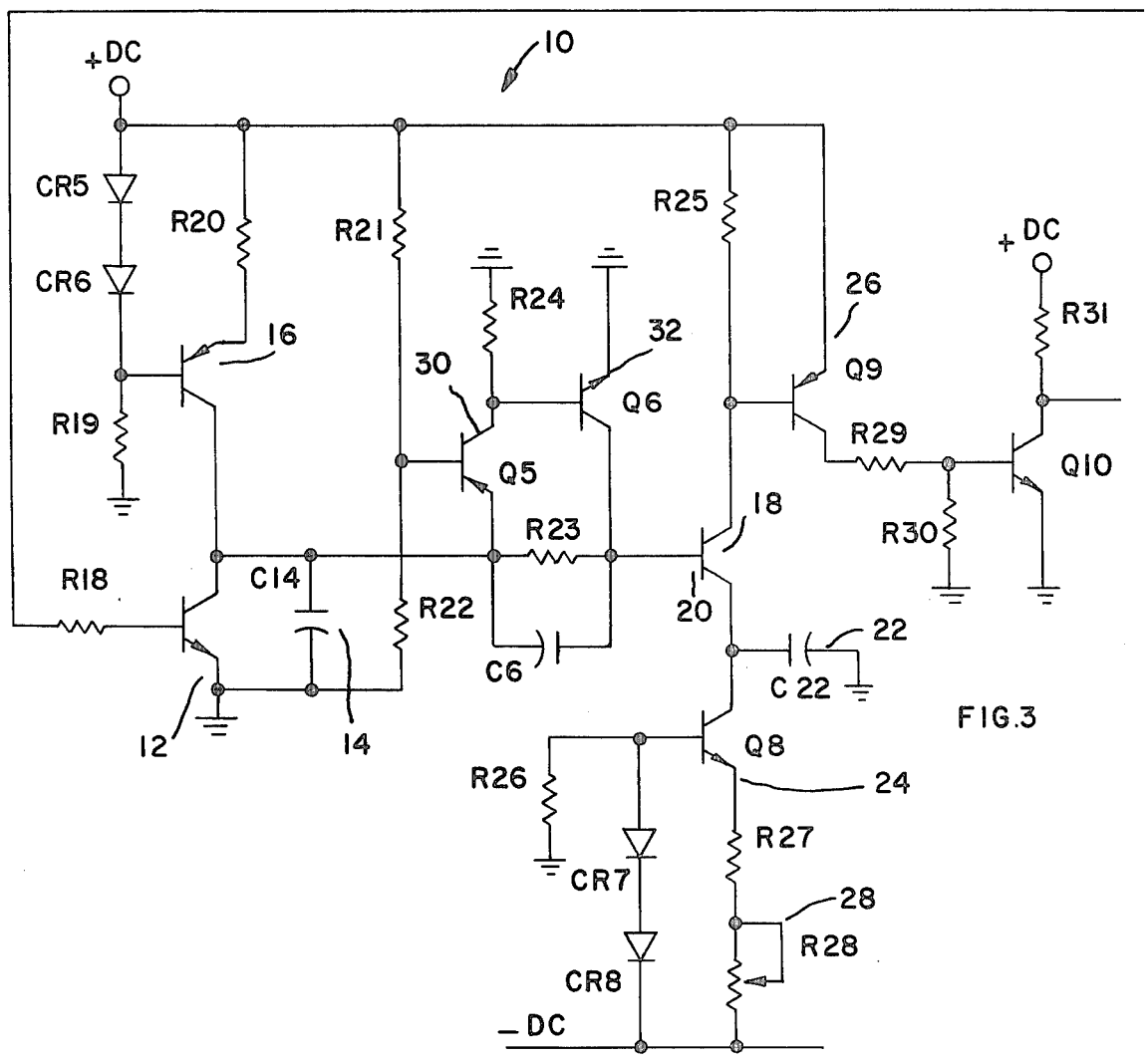
FIG. 3 is an electrical schematic of the subject circuit.
Figure 4:
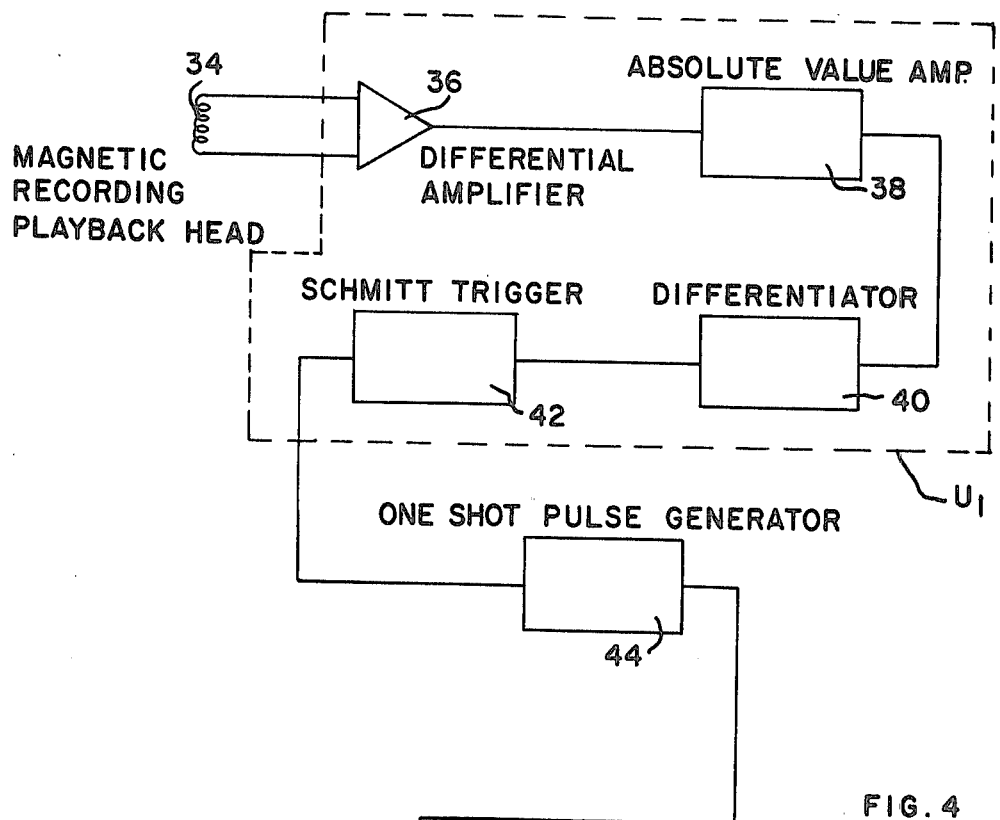
FIG. 4 is a block level schematic of a circuit employing the subject circuit.
Figure 4:
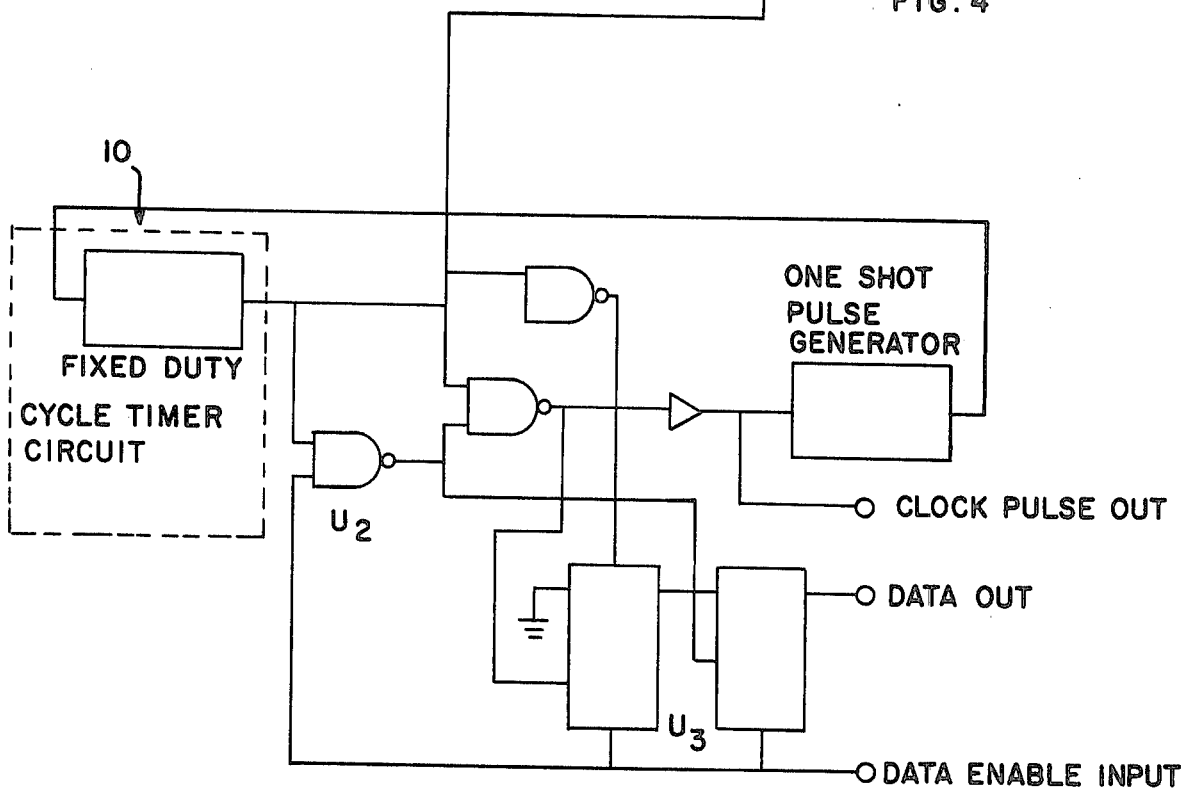

A schematic representation of the subject circuit 10 is shown in FIG. 3, and a discrete circuit implementation of the subject circuit 10 shown at block level in FIG. 4. With reference to FIG. 4, a read head signal from a magnetic secondary play-back head 34 is processed by operational amplifiers U1 which include a differential amplifier 36, an absolute value amplifier 38, a differentiator 40, a Schmitt trigger 42, and a one shot pulse generator 44. This processing produces narrow pulses corresponding to play-back peaks. These pulses are separated by 2 to 1 timing relationship with binary 0's at half frequency and binary 1's at full frequency. A preamble of 0's is recorded to start the timer circuit 10.

Referring now to FIG. 3, transistor elements 30 and 32 provide a starting circuit for the subject circuit 10. If no pulses are detected, both elements 30 and 32 conduct and keep C22 in a discharged starting condition. The first pulse detected discharges C14 and causes elements 30 and 32 to shut off. C22 follows C14 in voltage as C14 charges due to constant current from source 16, and the circuit 10 starts generating the 75% duty cycle after the next input pulse. Voltage follower impedance buffer 18 is shown to be a transistor, with the unidirectional charging element 20 being the base emitter junction of that transistor. The discharging current from C22 is made ⅓ the charging current of C14 by appropriate adjustment of a variable resistance element 38.

With reference to FIG. 4, U2 two input gate provides the starting logic to decipher 1's and 0's based on the output from the timer circuit 10. Pulses received during the first 75% of a clocking period are passed to U3 flip-flop as data (binary 1's). Pulses received after expiration of the timer are interpreted as clock pulses and cause a reset pulse to the timer circuit 10.

Figure 5:
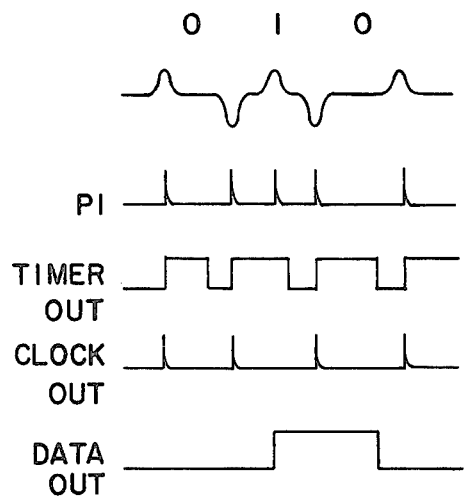
FIG. 5 is a graphical representation of the input and output waves of the circuit of FIG. 4 in response to a binary input.

The waveforms of the input pulses P1, the timer out, the clock out, and the data out portals are shown synchronically in FIG. 5. The subject circuit can operate over a 40 to 1 clocking period variation so long as the variation is gradual, and the circuit can easily be adapted to LSI clip design.

The present invention may be subject to a number of changes and modifications without departing from the spirit or essential characteristics thereof. The present embodiment is therefore intended in all respects as being illustrative and not restrictive of the scope of the invention.

What is claimed is:

1. An electronic duty cycle timer circuit for separating clock and data pulses contained in an input pulse train resulting from a two frequency encoded magnetic recording, said pulses being separated by two to on time relationships, said circuit comprising:
   first capacitive means;
   charging current source means electrically connected to said first capacitive means for delivering a constant rate of charging current thereto;
   reset pulse discharge means electrically connected to said first capacitive means for delivering a reset pulse thereto to cause said first capacitive means to discharge, said charging current serving to recharge said first capacitive means following said discharge;
   second capacitive means electrically connected to said first capacitive means;
   unidirectional means electrically interposed between said first and second capacitive means, said unidirectional means permitting current to flow therethrough to said second capacitive means when the voltage potential level of said first capacitive means exceeds the voltage potential level of said second capacitive means, said unidirectional means preventing current to flow therethrough when the voltage potential level of said second capacitive means exceeds the voltage potential level of said first capacitive means, said unidirectional means being conductive during a second portion of an input pulse interval and nonconductive during a first duty cycle portion of said input pulse interval, and the voltage across said unidirectional means changing between said duty cycle portion and said second portion of said input pulse interval;
   voltage follower impedance buffer means electrically interposed between said first and second capacitive means for providing charging current to said second capacitive means during said second portion of said input pulse interval, said second capacitive means following said first capacitive means in voltage during said second portion of said input pulse interval;
   discharging current source means electrically connected to said second capacitive means for discharging said second capacitive means at a constant rate during said second portion of said input pulse interval, a duty cycle period to input pulse internal ratio being fixed by the selected relative value of said first capacitive means to said second capacitive means, and said charging current source means to said discharging current source means;
   current threshold sensing switch means electrically connected to said unidirectional means for electrically sensing said change in voltage levels between said first duty cycle portion and said second portion of said input pulse interval.

2. A circuit as set forth in claim 1 wherein said first capacitive means comprises a main saw tooth capacitor.

3. A circuit as set forth in claim 1, wherein said charging current source means comprises a biased transistor.

4. A circuit as set forth in claim 1, wherein said reset pulse discharge means comprises a transistor.

5. A circuit as set forth in claim 1, wherein said second capacitive means comprises a discharge capacitor.

6. A circuit as set forth in claim 1, wherein said voltage follower impedance buffer means comprises a transistor, and said unidirectional means comprises a base emitter junction of said transistor.

7. A circuit as set forth in claim 1, said discharging current source means comprising a biased transistor.

8. A circuit as set forth in claim 1, said current threshold sensing switch means comprising a transistor.

* * * * *